United States Patent [19]
Matumura

[11] Patent Number: 5,828,581
[45] Date of Patent: Oct. 27, 1998

[54] AUTOMATIC LAYOUT SYSTEM

[75] Inventor: Miho Matumura, Kanagawa, Japan

[73] Assignee: NEC Corporation, Tokyo, Japan

[21] Appl. No.: 632,134

[22] Filed: Apr. 15, 1996

[30] Foreign Application Priority Data

Apr. 14, 1995 [JP] Japan ................................. 7-088915

[51] Int. Cl.$^6$ ........................... G06F 17/50; G06F 17/17
[52] U.S. Cl. ........................ 364/489; 364/488; 364/490; 364/491
[58] Field of Search ................................. 364/488–491, 364/578

[56] References Cited

U.S. PATENT DOCUMENTS

| 4,815,003 | 3/1989 | Putatunda et al. | 364/491 |
| 5,532,934 | 7/1996 | Rostoker | 364/488 |

OTHER PUBLICATIONS

Eschermann et al., ("Hierarchical placement for macrocells: a 'meet in the middle' approach", IEEE Comput. Soc. Press, IEEE International Conference on Computer–Aided Design, pp. 460–463, 7 Nov. 1988).

Kitazawa et al., (PTO 97–5063, translation of Japanese article, "Statistical Prediction of Block Form in Polycell Layout", Association of Information Processing, 27th Convention of the Information Processing Society of Japan, Jan. 1983, pp. 1479–1480).

Kurdahi et al., ("LAST: a layout area and shape function estimator for high level applications", IEEE Comput. Soc. Press, Proceedings of the European Conference on Design Automation, 25 Feb. 1991, pp. 351–355).

Kurdahi et al., ("Techniques for area estimation of VLSI layouts", IEEE Transactions on Computer–Aided Design of Integrated Circuits and Systems, vol. 8, No. 1, pp. 81–92, Jan. 1989).

Pedram et al., ("Interconnection length estimation for optimized standard cell layouts", IEEE Comput. Soc. Press, 1989 IEEE International Conference on Computer–Aided Design, pp. 390–393, 5 Nov. 1989).

Pedram et al., ("Accurate prediction of physical design characteristics for random logic", IEEE Comput. Soc. Press, Proceedings of the 1989 IEEE International Conference on Computer Design: VLSI in Computers and Processors, pp. 100–108, 2 Oct. 1989).

Sechen, ("Chip–planning, placement and global routing of macro/custom cell integrated circuits using simulated annealing", IEEE, Proceedings of the 25th ACM/IEEE Design Automation Conference, pp. 73–80, 12 Jun. 1988).

Upton et al., ("Integrated placement for mixed macro cell and standard cell designs", IEEE, 27th ACM/IEEE Design Automation Conference, 24 Jun. 1990, pp. 32–35).

(List continued on next page.)

Primary Examiner—Emanuel Todd Voeltz
Assistant Examiner—Phallaka Kik
Attorney, Agent, or Firm—Foley & Lardner

[57] ABSTRACT

An automatic layout system comprises an input unit to which an LSI design data containing a net list and a cell library data is input, a data processor operating under the control of a program, a memory for storing a first area estimate and a second area estimate, and an output unit. The data processor comprises first decision section which determines a layout style of the LSI, a first area calculation section which performs calculation of the first area estimate upon the presence of I/O cells, a second decision section which determines values of coefficients, a second area calculation section for calculating the second area estimate by using the coefficient in a formula, and a third area calculation section which selects one of the first and second estimates as an output area evaluation. An accurate estimated area can be obtained whether or not given design data is chip data.

11 Claims, 11 Drawing Sheets

OTHER PUBLICATIONS

Kurdahi et al. ("Evaluating layout area tradeoffs for high level applications", IEEE Transactions on Very Large Scale Integration Systems, vol. 1, No. 1, Mar. 1993, pp. 46–55). "A Statistical Projection of a Block Configurations on Poly–Cell Layout", 27th Convention of the Information Processing Society of Japan, 1983.

Chen et al. ("A module area estimator for VLSI layout", IEEE, Proceedings of 25th ACM/IEEE Design Automation Conference, 12 Jun. 1988, pp. 54–59).

7–88915, "*A Statistical Projection of a Block Configuration on Poly–Cell Layout*"; 27th Convention of the Information Processing Society of Japan; 1983.

AUTOMATIC LAYOUT SYSTEM

BACKGROUND OF THE INVENTION (a) Field of the Invention

The present invention relates to an automatic layout system and, more particularly, to an automatic layout system used for evaluating a chip area in a layout design of a semiconductor integrated circuit.

(b) Description of the Related Art

A procedure used in the prior art in designing a layout of a semiconductor integrated circuit (inclusive of a large scale integrated circuit, and hence will be collectively referred to as an LSI hereinafter) will be briefly described first with reference to FIG. 1 showing a flowchart of a computer system for layout designing.

Initially, on the basis of a layout cell library for each type of cells and a net list for a target LSI, which are supplied as input data, an initial evaluation of the area for the LSI is made at step F1. A floor planning which lays particular cells and particular nets within the evaluated area is conducted at step F2, and the automatic layout process for the cells and nets is carried out at step F3. Subsequently, an examination is made to see if the cell area which results from the automatic layout process remains in a target error range from the initial evaluated area, at step F4. If the resultant cell area remains within the target range, the layout design process is completed. On the other hand, when the resultant cell area exceeds the given error range, the layout process returns to the floor planning at step F2 and the procedure is repeated beginning with the step F2 to further carry out a layout design.

If the initial area evaluation which takes place at step F1, namely, at the start of the design, exhibits a good accuracy, it is unnecessary to return to the step F1, thus reducing the iteration or number of steps required in the layout design. Conversely, if the initial area evaluation has a poor accuracy, the operation must repeatedly return to the step F2, thus increasing the number of steps required in the layout design. An initial area evaluation for the layout is used as a design procedure for projecting a required cell area at an early stage in the layout design of an LSI.

The initial area evaluation is defined as a subsystem generally in the automatic layout system. To give an example, an initial area evaluation system for an automatic layout system called "A-STAR" will be described first. It is to be noted that the subsequent description of the automatic layout system "A-STAR" is based on an article "A Statistical Projection of a Block Configuration on Poly-Cell Layout", presented at 27th Convention of the Information Processing Society of Japan.

FIG. 2 is a block diagram of a conventional initial area evaluation system used at the step F1 of FIG. 1. The system comprises an input unit 11 which is used to enter design data for an LSI, a data processor 12 implementing an area calculation section 13 operating under the control of a calculation program, and an output unit 14 including a display unit.

In FIG. 2, LSI design data fed through input unit 11 is supplied to data processor 12, and specifically, to the area calculation section 13 contained therein. Area calculation section 13 derives an initial evaluated area according to a formula, and the evaluated value thus obtained is then fed to the output unit 14 to be delivered therefrom. The evaluated area is determined as follows:

$$Area = ALL + INS + MACRO + IO,$$

wherein ALL is a sum of a total of areas for cells of a standard cell type and a total of areas for cells of a building block type (i.e., macro cell type), INS is a total of areas for cells of the standard cell type, MACRO is a total of products each including (peripheral length of one of the building block cells)×(number of terminals of the one of the building block cells)×(spacing of interconnects i.e., routing pitch), and 10 is (a total of lengths of the I/O cells parallel to the periphery of the chip)×(number of the I/O cells)×(routing pitch).

The initial area evaluation system of FIG. 2 will be described more specifically with reference to an example in which LSI design data supplied from the input unit 11 relates to a chip, i.e., a layout style in which I/O cells are arranged in the peripheral area thereof. LSI design data from the input unit 11 is fed to the area calculation section 13 where an initial area evaluation is performed using the formula as described above. Assuming that ALL is equal to 200,000, INS to 100,000, MACRO to 50,000, the total length of I/O cells to 24,000, the number of I/O cells to 100, and a mean value of spacings of the interconnects to 5, it follows from the above formula that the evaluated area is equal to 12,350,000, whereas, in actuality, this value should be 36,000,000 when calculated based on the total length for the I/O cells, which provides the area of the chip area of $(24,000/4)^2$.

In the initial area evaluation system for an automatic layout system of the prior art, the evaluation system has a poor accuracy for the evaluation of the initial area, resulting in disadvantages that the probability that the error resulting from the layout design of LSI remains within a target range is very low, and that the operation must frequently return to an intermediate step in the procedure of the layout design, thus increasing the number of steps required in the layout design.

SUMMARY OF THE INVENTION

In view of the foregoing, it is an object of the present invention to provide an automatic layout system capable of calculating an output area data with a sufficient accuracy.

According to the present invention, there is provided an automatic layout system for receiving design data including a net list tabulating a plurality of nets in association with respective cells and cell library data, the layout system comprising:

first means for determining to which one of a standard cell type, a building block type, a mixed cell type and an input/output (I/O) cell type a cell in a given net list belongs and for determining whether the given net list relates to chip data or macro data, based on the cell library data;

second means for calculating a first area estimate based on first cells tabulated in the given net list and belonging to the I/O cell type;

third means for calculating a second area estimate based on the cells tabulated in the given net list and belonging to second cells other than the first cells; and fourth means for selecting one of the first and second area estimates as an output area data by comparing both the first and second estimates against each other, when the given net list relates to chip data.

In the automatic layout system according to the present invention, it is preferable that the fourth means selects the second area estimate when the given net list relates to macro data.

Further, the third means may include a first calculation given section for calculating the second area estimate by a formula and a second calculation section for determining parameters in the given formula.

Further, the automatic system may comprise fifth means for examining error of the output area data, wherein the fourth means further includes a third calculation section for updating the parameters based on the error included in the output area data.

Further, the second calculation section may determine a maximum number of interconnect layers for a cell in the net list based on the cell library data.

The present invention provides an automatic layout system including means for examining a cell type from the cell data in a given net list and a cell library data to determine to which one of a standard cell type, a building block type and a mixed cell type each cell contained in the input design data corresponds, and for determining if the LSI design data represents chip data or macro data. As a result, the accuracy of the area evaluation for the LSI can be substantially improved when the layout style represents chip data.

By providing means for examining the connection information for cells and information relating to the number of interconnect layers, in which the interconnects are connected to respective cells, in order to determine the values of parameters and factors to be used in a calculation formula for an area evaluation, the accuracy of an area evaluation corresponding to LSI design data can be advantageously improved.

Improved accuracy of the initial area evaluation reduces the number of times the operation returns to an intermediate step in the automatic layout design, thus reducing the number of steps required in the area cell design.

In the prior art, a large error in the evaluated chip area is partly caused by the fact that scarcely any significant consideration is paid to the layout style of the LSI, and consequently no optimization of the evaluation is made in a manner corresponding to the layout style. The error is generally caused by a large number of I/O cells. Evaluation of the chip area by using the above formula means that the area is evaluated independently from the layout style, unavoidably introducing a significant error. In addition, in the formula used for calculating the chip area, the calculation is based on an assumption that a two layer structure is used, without taking into consideration the possible number of interconnect layers in which the interconnects are connected to respective cell. With this prior art, the error in the area evaluation will remain on the order of 15% for a two layer structure, whereas the error will be as high as on the order of 25%, even for good cases, where the number of the maximum interconnect layers, in which the interconnects are connected to the cell, is equal to three or greater. The larger the number of the interconnect layers, the larger the magnitude of the error will result.

DESCRIPTION OF PREFERRED EMBODIMENTS

Figure 1:
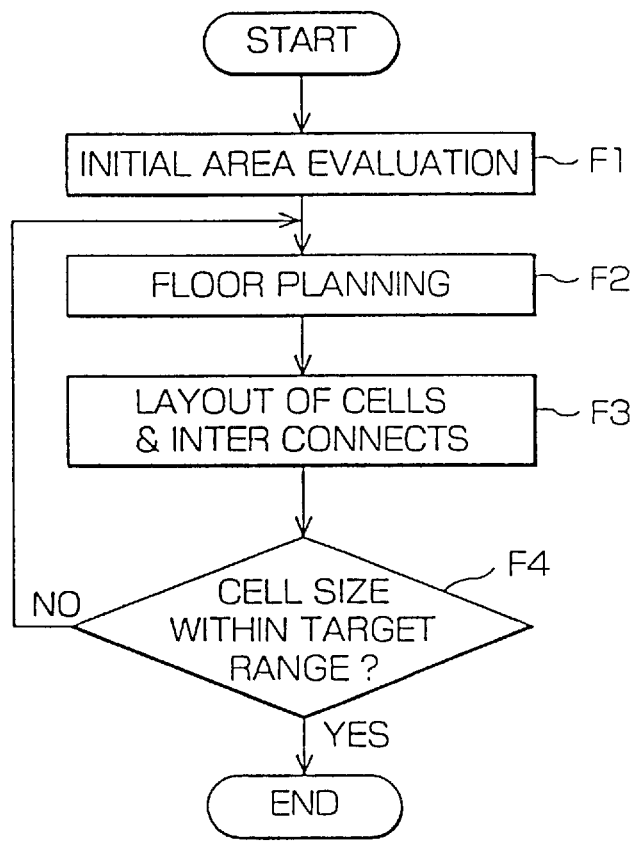
FIG. 1 is a typical flow chart illustrating an automatic layout design.
Figure 2:
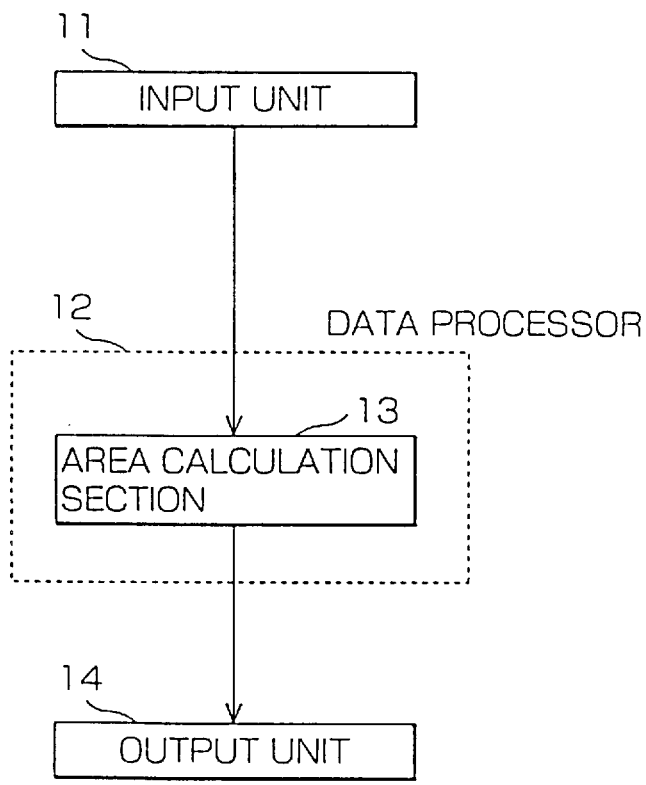
FIG. 2 is a block diagram of a conventional initial area evaluation system used in the process of FIG. 1.
Figure 3:
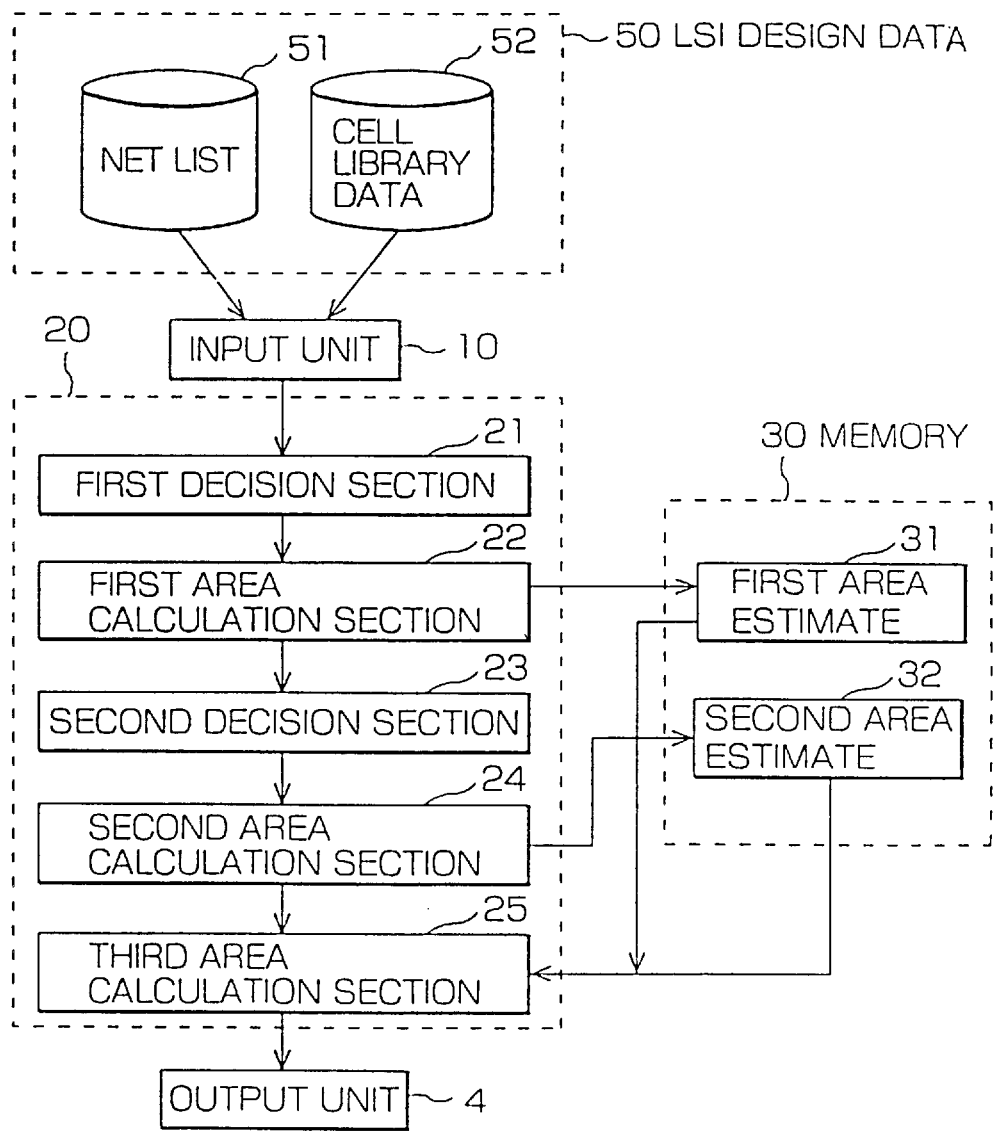
FIG. 3 is a block diagram of an initial area evaluation system in an automatic layout system according to a first embodiment of the invention.

Referring to the accompanying drawings, preferred embodiments of the invention will now be described. FIG. 3 shows an area evaluation system in an automatic layout system according to a first embodiment of the invention. As shown, the area evaluation system comprises an input unit 10, receiving design data 50 for an LSI including a net list 51 for the LSI and a cell library data 52 for all kinds of cells listed in the net list, a data processor 20 which operates under the control of a program, a memory 30 for storing information including a first area estimate 31 and a second area estimate 32, and an output unit 40 including a display unit etc.

The data processor 20 includes a first decision section 21 which determines a layout style of the LSI from the input design data, a first area calculation section 22 which performs an area evaluation using cell data of I/O cells retrieved from the cell library data 52 so as to generate the first area estimate 31, a second decision section 23 which determines, for each cell type of the cell, the values for the parameters and factors in a formula for the calculation of the area of the LSI based on the net list 51 and the maximum number of interconnect layers for respective cells, in which the interconnects are connected to the respective cells, a second area calculation section 24 which performs calculation using the calculation formula to generate the second area estimate 32, and a third area calculation section 25 which compares the first area estimate obtained by the first calculation section 22 with the second area estimate obtained by the second calculation section 24, both stored in the memory 30, to thereby optimize the output value of the area evaluation. The operation of the present embodiment will be further described below with reference to FIGS. 3 to 10.

Figure 4:
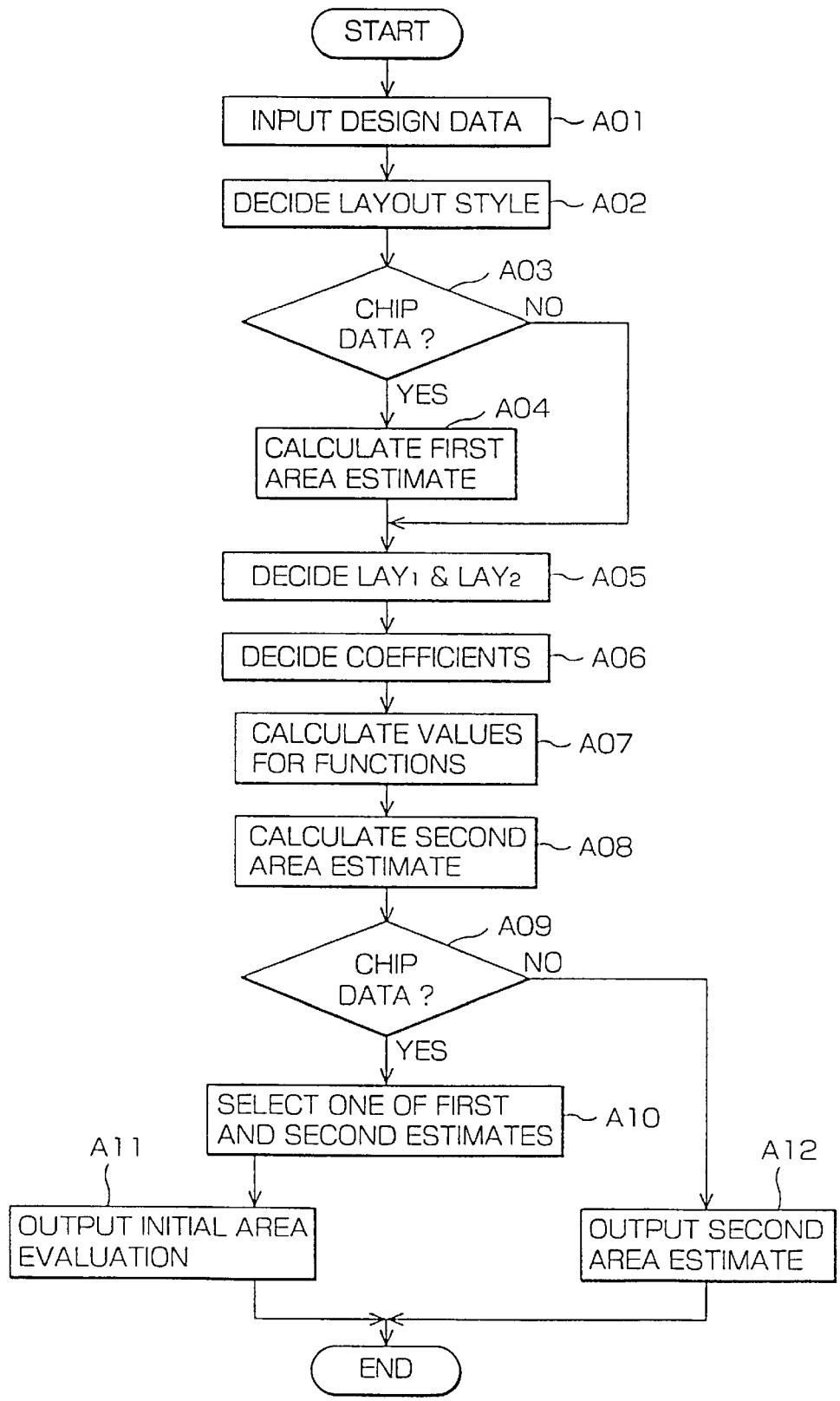
FIG. 4 is a flow chart indicating a procedure used in the initial area evaluation system of FIG. 3.
Figure 5:
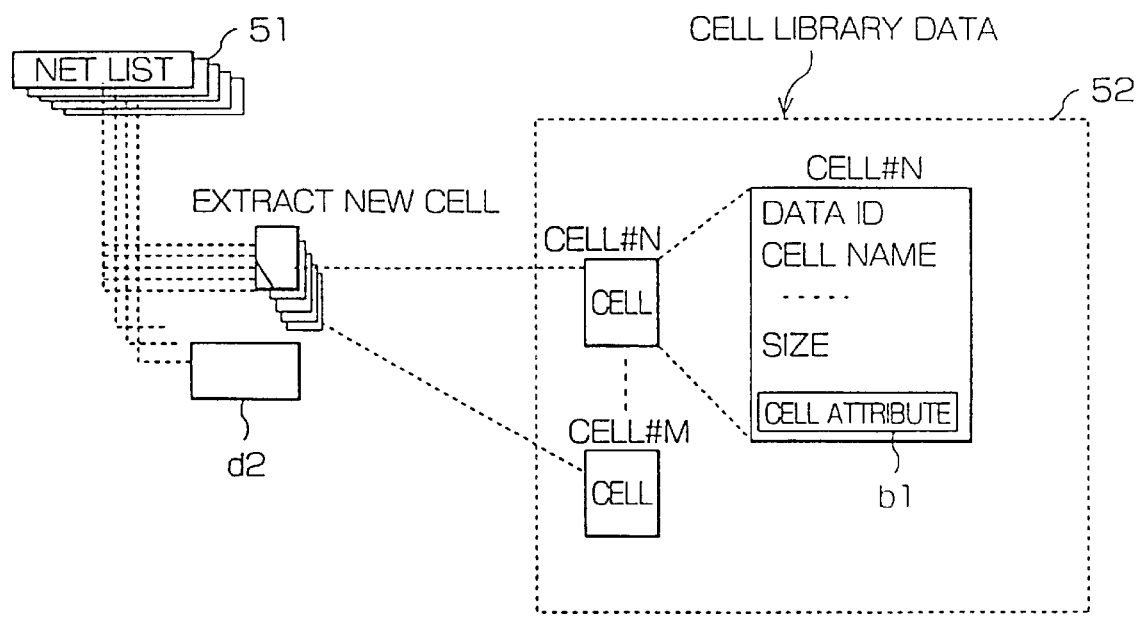
FIG. 5 is a schematic illustration of the structure of input design data used in the initial area evaluation system of FIG. 3.

In FIG. 3, LSI design data 50 is supplied to the data processor 20 through the input unit 10, whereby the net list 51 and the cell library data 52 which are contained in the LSI design data 50 are fed to the first decision section 21, at step A01 in FIG. 4. The first decision section 21 determines a cell type for each cell and a layout style of the LSI in accordance with the data in the net list. FIG. 5 shows the manner in which the cell type is determined. First, any cell is extracted from the net list 51 in which the cell is listed in association with nets, i.e., interconnects. Each cell thus extracted is retrieved from the cell library data 52 to determine the cell type based on the cell specification including its attributes b1. Thus, each cell is determined to be one of standard cell, macro cell (i.e., building block) and I/O cell at step A02 in FIG. 4.

The procedure executed by the first decision section 21 to determine the layout style of the LSI will be described with reference to the flowchart shown in FIG. 6. Flags including Flag 1, Flag 2 and Style Flag for enabling decision concerning the cell type and layout style are provided, and reset to "0" at step B1. An examination is made to see if a remaining net is still present in the net list 51 at step B2. If it is found that no such net is present at step B2 as a result of the precedent procedure, then the operation proceeds to the examination of Flags at step B4 to end the determination procedure.

On the other hand, if a remaining net is found at step B2, then the operation proceeds to step B3 where it is examined if there is a new cell, connected to the remaining net, other than the cells which are already found in the precedent procedure. If it is found that no new cell is present at step B3, the operation returns to the step B2 again, thus examining the presence of a remaining net in the net list 51. If a new cell is found at step B3, the attribute of the new cell is retrieved from the cell library data 52, and a corresponding one of Flags is set at step B5, whereupon the operation returns to step B3.

The procedure at step B5 in FIG. 6 to set a corresponding flag will be described more specifically with reference to FIG. 7. The cell attribute is sequentially examined cell by cell whether it indicates a standard cell at step C1, a macro cell at step C2 or an I/O cell at step C3. A corresponding one of Flag 1, Flag 2 and Style Flag is set at "1" based on the result in examination at step C4, C5 or C6.

Figure 6:
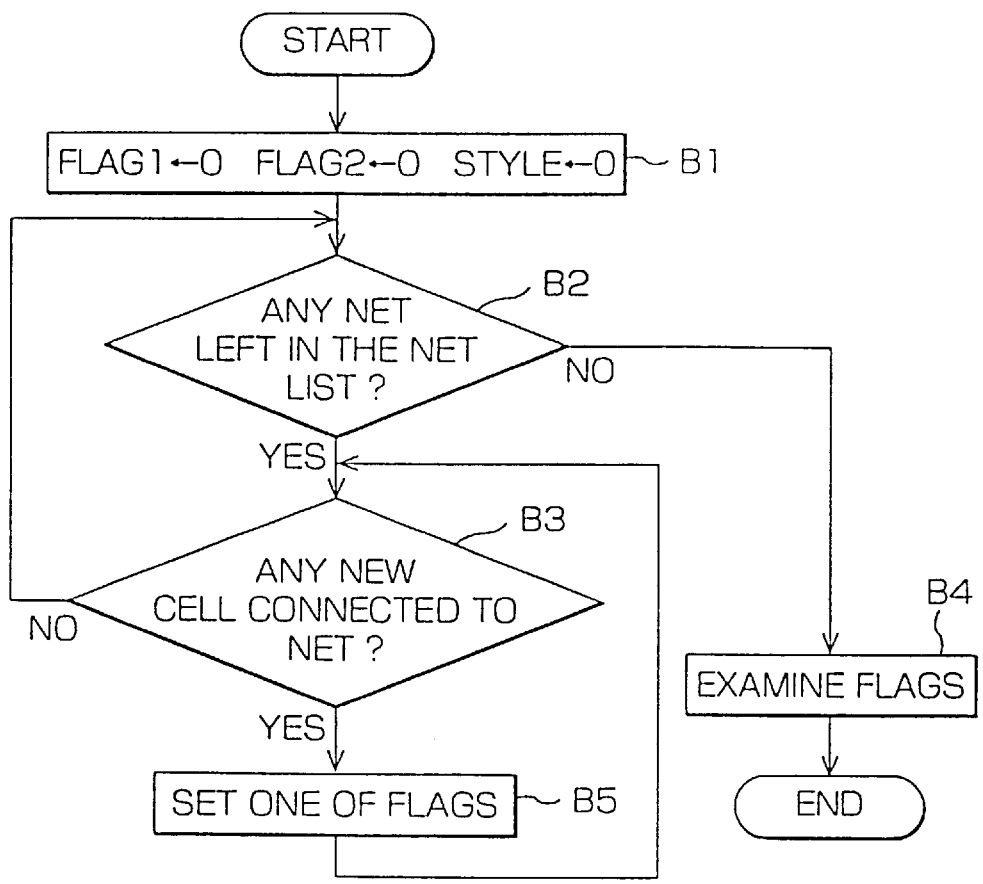
FIG. 6 is a flow chart indicating a procedure used in the first decision section in FIG. 3.
Figure 7:
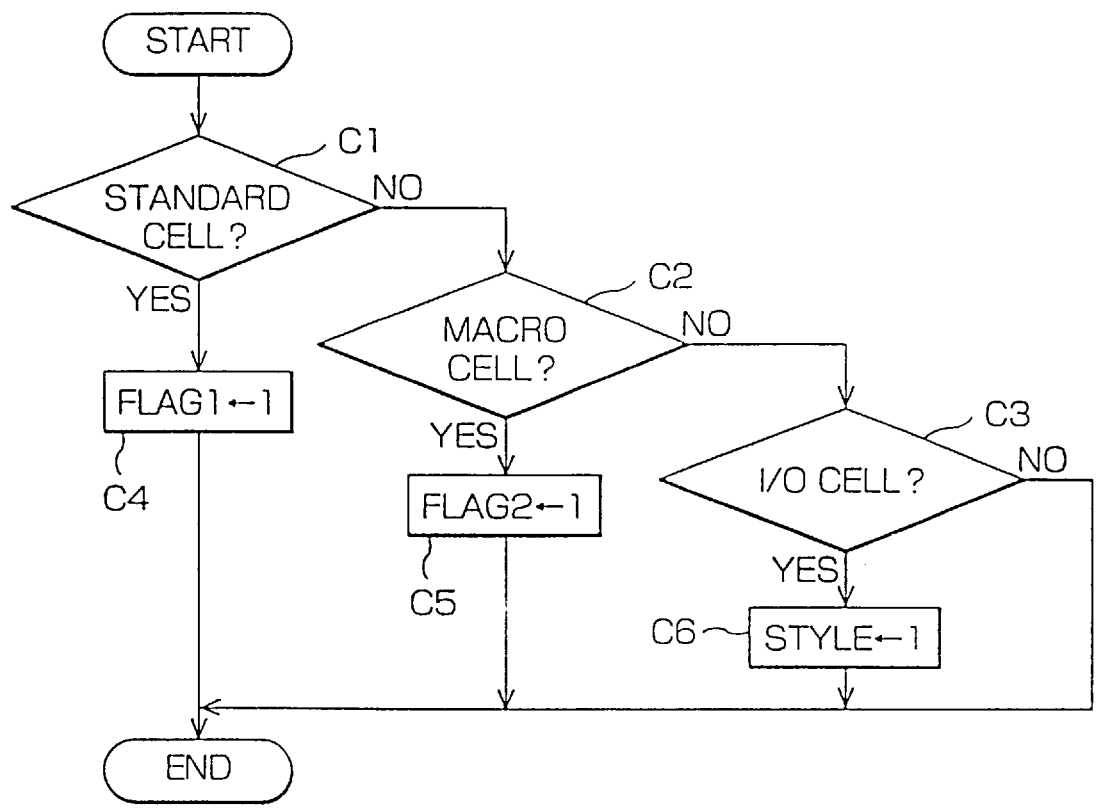
FIG. 7 is a flow chart indicating a second procedure used in the first decision section in FIG. 3.
Figure 8:
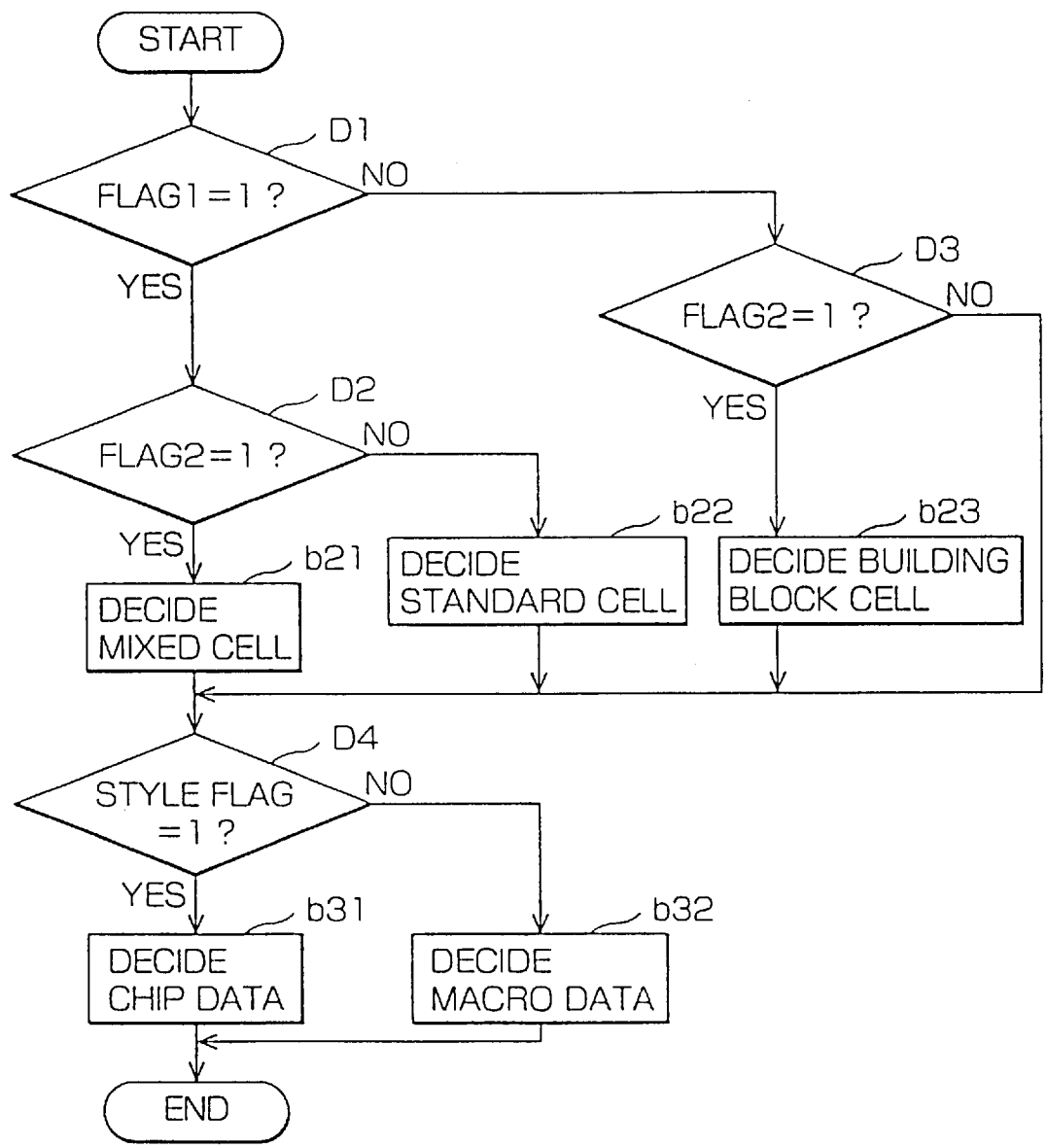
FIG. 8 is a flow chart indicating a third procedure used in the first decision section in FIG. 3.
Figure 9:
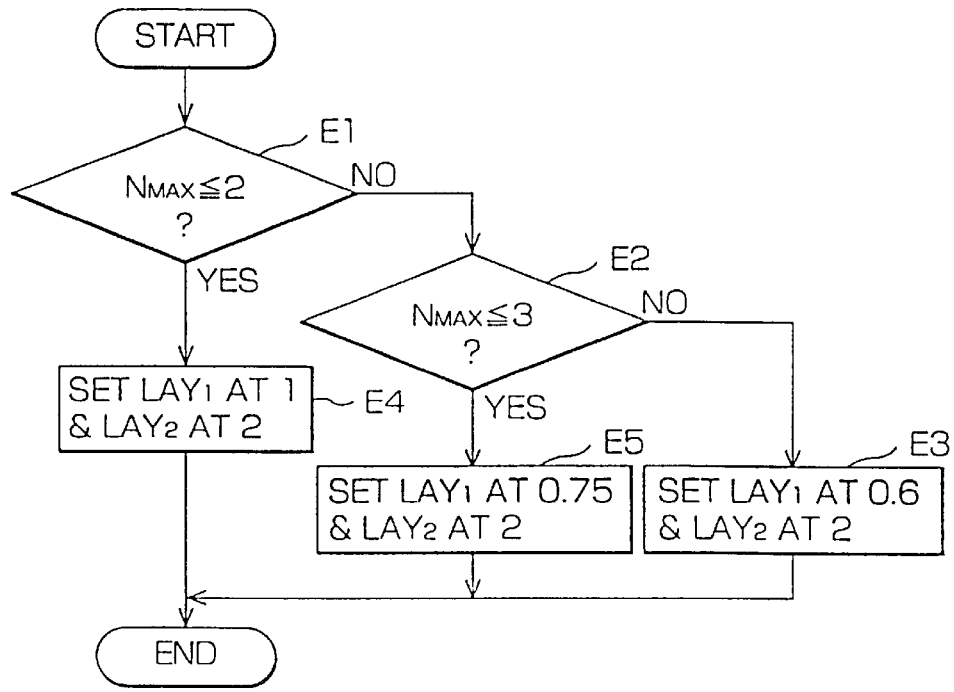
FIG. 9 is a flow chart indicating a procedure used in the second decision section in FIG. 3.

Referring to FIG. 8, the procedure at step B4 in FIG. 6 to determine the cell type of each cell and layout style of the LSI by examining the flags will be more specifically described. When Flag 1 corresponding to a standard cell is "1" and Flag 2 corresponding to a macro cell (building block) is also "1", the present LSI data is determined to be of a mixed cell type (steps D1, D2 and b21). When Flag 1 corresponding to the standard cell is "1" and Flag 2 corresponding to the macro cell is riot "1", the present LSI data is determined to be of a standard cell type (steps D1, D2 and b22). When Flag 1 corresponding to the standard cell is not "1" while Flag 2 corresponding to the macro cell is "1", the present LSI data is determined to be of a building block type (steps D1, D3 and b23). Each of the steps D3, b21, b22 and b23 continues to step D4, where it is determined whether or not Style Flag corresponding to the presence of I/O cell is "1". If Style Flag is "1", then a decision is made that the present LSI data represents chip data, and otherwise, it is determined to be macro data at steps b31 and b32, respectively. The "macro data" as used herein means that the LSI data corresponds to internal circuit data, for example, in a semiconductor chip exclusive of I/O cells and related interconnects.

Referring back to FIG. 4, in the event that the first decision section determines that the input LSI data represent chip data at step A03, the first area calculation section 22 performs an area calculation in accordance with the data for I/O cells at step A4. The evaluated area thus obtained is fed to the memory 3, where the evaluated area is stored as a first area estimate 31.

Figure 10:
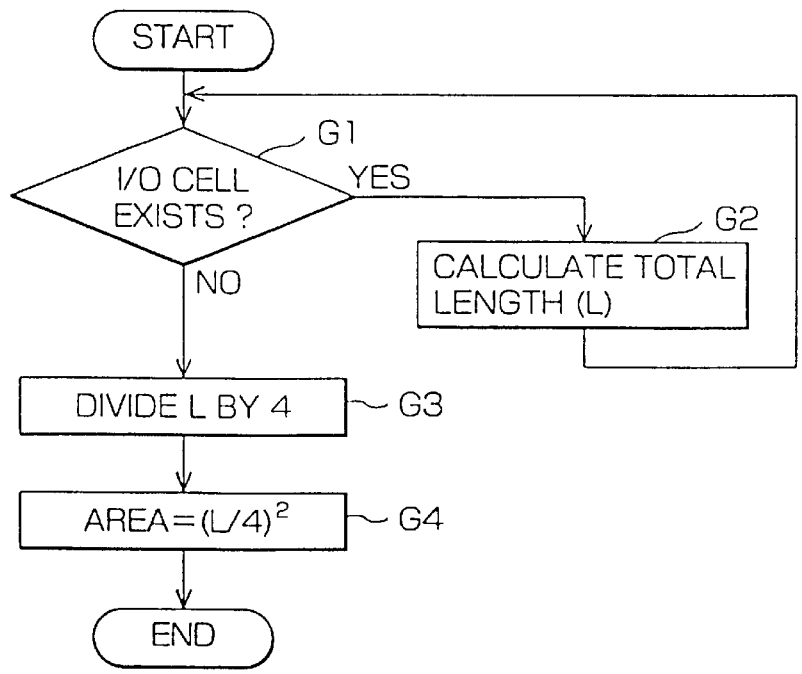
FIG. 10 is a flow chart indicating a procedure used in the first area calculation section in FIG. 3.

The operation which takes place at step A04 by the first area calculation section 22 will be described with reference to FIG. 10. When the presence of I/O cells is found in step G1, a peripheral length (L) of the chip is estimated by adding together the sides, along the periphery of the chip, of all the cells having the I/O cell attribute at step G2. The peripheral length (L) is divided by 4 at step G3 and the quotient thus obtained is considered as the length of one of the sides of the chip, which is then squared at step G4 to obtain an evaluated area for the chip, i.e., a first area estimate.

The second decision section 23 determines coefficients or parameters to be used in the calculation formula to be used for determining a second area estimate for the initial area evaluation. These coefficients or parameters relates to spaces for interconnects and are determined on the basis of the LSI design data 50 at steps A05 and A06 in FIG. 4. A procedure used to determine data relating to the number of interconnect layers will be described in detail with reference to FIG. 9. In the same drawing, an examination is first made to see if the maximum number ($N_{MAX}$) of the interconnect layers, in which the interconnects can be connected to the cell concerned, $N_{MAX} \leq 2$ or $2 < N_{MAX} \leq 3$ at steps E1 and E2. If the $N_{MAX} \leq 2$ for the cell concerned, then first coefficient ($lay_1$) is set to "1" while a second coefficient ($lay_2$) is set to "2" at step E4. If $2 < N_{MAX} \leq 3$ for the cell, then the first coefficient ($lay_1$) is set to "0.75" while the second coefficient ($lay_2$) is set to "1.25". Otherwise, namely, if $N_{MAX} < 3$, then the first coefficient ($lay_1$) is set to "0.6" while the second coefficient ($lay_2$) is set to "0.75". These coefficients which are to be used in the calculation formula for the initial evaluation established by the second decision section 23 are is set to "0.75". These coefficients which are to be used in the calculation formula for the initial evaluation established by the second decision section 23 are transmitted to the second area calculation section 24.

The layout data which has been used in the first decision section 21 to determine which one of the standard cell type, building block type and mixed cell type the present LSI data corresponds to is entered into the second area calculation section 24, which then performs a calculation for the area evaluation according to one of the calculation formulae (1), (2) and (3) as described below, which corresponds to the standard cell type, building block type and mixed cell type, respectively. A calculated value is stored as a second area estimate 32 in the memory 3 at steps A07 and A08.

The formulae for the second area estimate are as follows:
Standard Cell Type $$\text{Area} = \text{ALL} + ILS \qquad (1)$$
$$= \text{ALL} + \Sigma\, S_{INS} \times (N \times CONN_2 \times G_2) \times lay_2,$$

where ALL is a total of internal cell areas, $\Sigma S_{INS}$ is a total of areas of cells each having a standard cell attribute, N is a number of interconnects connected to the each of the cells having the standard cell attribute, $CONN_2$ is a coefficient relating to the number of interconnects for the each of the cells, $G_2$ is a coefficient relating to spacing of the interconnects, and $lay_2$ is the second coefficient as mentioned above. For example, $CONN_2$ and $C_2$ are 0.001 and 1.0, respectively.
Building Block Type $$\text{Area} = \text{ALL} + \text{MACRO} \qquad (2)$$
$$= \text{ALL} + \Sigma\, S_{MACRO} \times (N \times CONN_1 \times G_1) \times lay_1,$$

where ALL is a total of internal cell areas, $\Sigma S_{MACRO}$ is a total of areas of cells each having a macro cell attribute, N is a number of interconnects connected to the each of the cells having the macro cell attribute, $CONN_1$, is a coefficient relating to the number of interconnects for the each of the cells, $G_1$ is a coefficient relating to spacing of the interconnects, and $lay_1$ is the first coefficient as mentioned above. For example, $CONN_1$ and $G_1$ are 0.001 and 1.0, respectively.

Mixed Cell type $$\text{Area}=\text{ALL}+\text{INS}+\text{MACRO},\qquad(3)$$

where the signs are the same as defined in equations (1) and (2).

If the input layout data relates to chip data, then the first area estimate 31 and the second area estimate 32, both stored in the memory 3, are compared against each other in the third area calculation section 25 to determine an output evaluated area for the input layout data, based on the formula indicated below at steps A09 and A10.

If first area estimate≧second area estimate:
  initial evaluated area=first area estimate.
If first area estimate<second area estimate:
  initial evaluated area=second area estimate.

The output evaluated area thus determined is delivered from the output unit 4 at step A11.

If it is found at step A03 that the data is not one relating to a chip, then the second area estimate 32 stored in the memory 3 is determined as representing an output evaluated area, and is delivered from the output unit 4 at steps A09 and A12.

Now, a specific example for the procedure of the present embodiment will be described further with reference to FIGS. 3 to 7. It is assumed that input layout data indicates the presence of I/O cells and standard cells and that the layout data relates to the case of two layer AL interconnects.

Initially, on the basis of cell information contained in the net list 51 of the input layout data 50, the first decision section 21 determines the layout style of the LSI at step A02 in FIG. 4. The procedure to determine the layout style will be described with reference to part of the flow charts shown in FIGS. 4 and 5. As mentioned above, the existence of I/O cells and the standard cells in the input layout data renders Style Flag relating to a chip to be set to "1". Further, the layout data representing the presence of standard cells renders Flag 1 corresponding to the standard cell to be set to "1" at steps B4 and C4. Namely, it is determined in this example that the input layout data is one relating to a layout of standard cells and relating to chip data.

After the input data is determined to be relating to a chip at step A03, a calculation from the view point of arrangement of I/O cells is made at step A04, and the resultant area evaluation is stored as a first area estimate 31 in the memory 30. Based on the maximum number (two) of the AL interconnect layers for the cell, the second coefficient ($lay_2$) relating to the number of interconnect layers are determined at step A05 and the values of the respective coefficients ($CONN_2$ and $G_2$), which are required in the calculation in the formula (1)) are established at step A06. Then, each of the evaluation functions (ALL and INS) is calculated at step A07, and the calculation for the second area estimate 32 is made by a sum of the values of the functions ALL and INS. The resultant second area estimate 32 is stored in the memory 30 at step A08. Subsequently, the first area estimate 31 and the second area estimate 32 are compared against each other to determine an evaluated value at step A10, which is output through the output unit 4 as an output area evaluation.

A second embodiment of the invention will now be described with reference to FIG. 11 which shows a block diagram of this embodiment. The area evaluation system of the present embodiment comprises an input unit 10 to which an LSI layout data 50 containing a net list 51 and a cell library data 52 and a coefficient data 60 collected during precedent procedure are entered, a data processor 20 which operates under the control of a program, a memory 30 which stores a first area estimate 31, a second area estimate 32 and estimated coefficients 33 initially supplied as the coefficient data 60, and an output unit 40 including a display unit etc.

The data processor 20 comprises first decision section 21 which determines cell type a layout style for an LSI to be designed, first area calculation section 22 which evaluates a first area estimate 31 for the area of the LSI by using cell library data for I/O cells in the net list 51 based on the decision by the first decision means 21, second decision section 23 which determines the values of coefficients to be used in a calculation formula to provide a second area estimate for the area for each layout style based on the maximum number of the interconnect layers and the net list, third decision section 26 which optimizes such coefficients based on the data which have been collected during the precedent area evaluation and stored in the memory 30, second area calculation section 24 which calculates the second area estimate 32 for the area by using the calculation formula for evaluation arid optimized coefficients, and third area calculation section 25 which compares the first area estimate obtained by the first calculating section 22 and the second area estimate obtained by the second calculating section 24 by selecting one of them to thereby obtain an evaluated area for the LSI.

Figure 11:
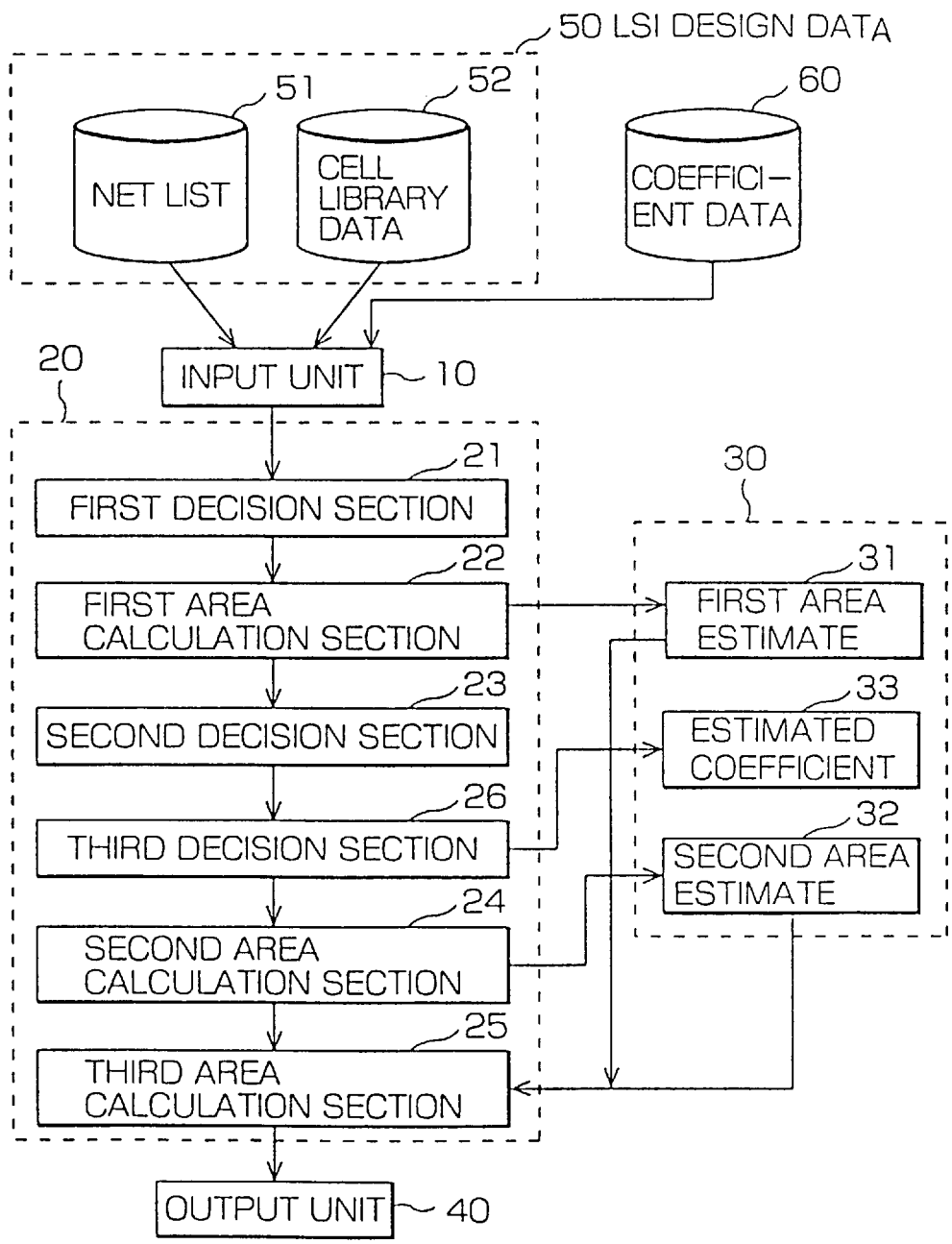
FIG. 11 is a block diagram of an initial area evaluation system in an automatic layout system according to a second embodiment of the invention.

It will be apparent from FIG. 11 that difference between the present embodiment and the first embodiment mentioned above resides in that coefficient data 60 collected during precedent procedure is supplied through the input unit 10 to be used in the calculation formula, that the memory 30 stores the coefficient data 60 as estimated coefficients 33 and that the data processor 20 additionally includes third decision section 26 designed to optimize the coefficients by modifying the coefficients obtained by the second decision section 23 based on the coefficient data 60, which are to be used in the calculation formula to derive an optimized evaluated area. It should be understood that the operations of the first decision section 21, the first area calculation section 22 and the second decision section 23 shown in FIG. 11 are similar to those in the first embodiment, and therefore will not be specifically described here for avoiding a duplication.

In the first embodiment mentioned above, the values of coefficients in the calculation formula have been fixed for each layout style of the LSI. It is difficult in fact to optimize such values for coefficients from empirical values. In the present embodiment, coefficients obtained by the third decision section 26 are optimized on the basis of the coefficient data 60 supplied from outside, which are obtained by the area evaluation system itself during precedent procedure. The procedure used by the third decision section 26 at this end will now be described with reference to FIG. 12.

The coefficient data 60 includes corrected data in the evaluated value obtained at the precedent evaluation in associated with the coefficients used in the precedent evaluation. Such results contained in the coefficient data 60 are stored in the memory 30 as the estimated coefficients 33 at step H1 in FIG. 12, which are to be used to determine the values of parameters in the calculation formulae (1), (2) and (3). The data stored in the memory 30 for the coefficients are used in the second area calculating section 24 to obtain the second area estimate according to the formula (1), in a manner similar to that in the first embodiment, and the third area calculation section 25 compares the first area estimate 31 and the second area estimate 32 against each other to select one of them as an evaluated area for the LSI, which is delivered through the output unit 4 as an initial area evaluation.

Figure 12:
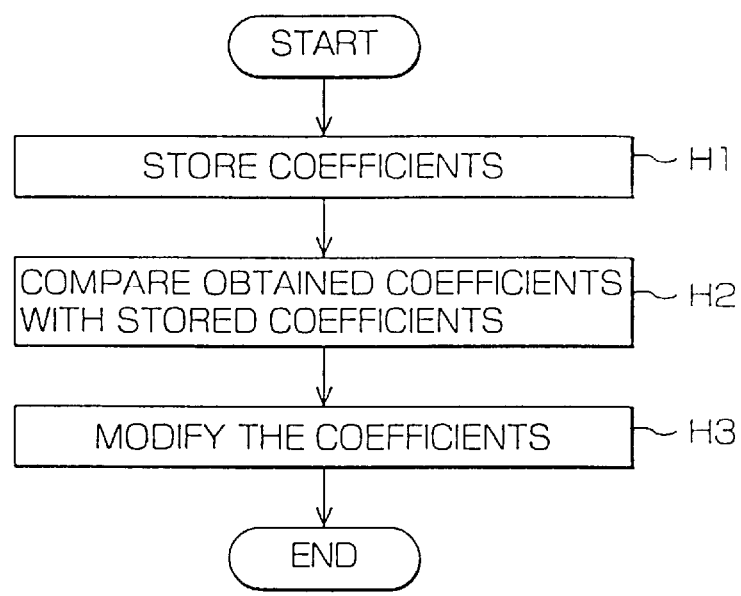
FIG. 12 is a flow chart of a procedure used in the third decision section in the area evaluation system of FIG. 11.

Data relating to the layout style, values of parameters and evaluation error or adjusted value, which are obtained in the final result of the LSI design, are compared against the corresponding data of the layout data, values of parameters and the corrected data stored as the estimated coefficients 33, respectively, at step H2 in FIG. 12, and the estimated coefficients are modified on the basis of the result of the comparison at step 113 and output to the coefficient data file 60 for next use.

In the first and the second embodiments, a first area estimate is calculated in the first area calculation section 22 by assuming a square of the chip area. However, it is also possible to evaluate the area as a rectangular area by selecting a suitable X–Y ratio.

Since above embodiments are described only for examples, the present invention is not limited to such embodiments and it will be obvious for those skilled in the art that various modifications or alterations can be easily made based on the above embodiments within the scope of the present invention.

What is claimed is:

1. An automatic layout system for receiving design data including a net list tabulating a plurality of nets in association with respective cells and cell library data, said layout system comprising:

first means for determining to which one of a standard cell type, a building block type, a mixed cell type and an input/output (I/O cell) type a cell in a given net list belongs and for determining whether the given net list relates to chip data or macro data based on the cell library data;

second means for calculating a first area estimate based on first cells tabulated in the given net list and belonging to the I/O cell type;

third means for calculating a second area estimate based on the cells tabulated in the given net list and belonging to second cells other than said first cells, said third means calculating said second area estimate based on the type determined by said first means; and fourth means for selecting one of said first and second area estimates as an output area data by comparing both the first and second estimates against each other, when the given net list relates to chip data.

2. An automatic layout system as defined in claim 1 wherein said fourth means further selects said second area estimate when the given net list relates to macro data.

3. An automatic layout system as defined in claim 1 wherein said third means includes a first calculation section for calculating said second area estimate by a given formula and a second calculation section for determining parameters in said given formula.

4. An automatic layout system as defined in claim 3 further including fifth means for examining the output area data to obtain adjusted data for the output area data, wherein said fourth means further includes a third calculation section for modifying the parameters based on the adjusted data.

5. An automatic layout system as defined in claim 3 wherein said second calculation section determines a maximum number of interconnect layers for a cell in the net list based on the cell library data.

6. An automatic layout system as defined in claim 1 wherein said first means includes a first section for resetting a style flag, a second section for examining presence of a remaining net in the net list, a third section for examining presence of a new cell connected to the remaining net in the net list, a fourth section for setting said style flag when the new cell belongs to I/O cell type, and a fifth section for determining whether the given net lists relates to chip data by examining a state of said style flag.

7. An automatic layout system as defined in claim 6 wherein said fourth section operates for determining whether a cell in the given net list belongs to the standard cell type, macro cell type or the mixed cell type other than the I/O cell type.

8. An automatic layout system as defined in claim 1 wherein said first means determines that given net list relates to chip data when a cell belonging to I/O cell type exist in the given net list.

9. An automatic layout system for receiving design data including a net list tabulating a plurality of nets in association with respective cells and cell library data, said layout system comprising:

first means for determining to which one of a standard cell type, a building block type, a mixed cell type and an input/output (I/O cell) type a cell in a given net list belongs and for determining whether the given net list relates to chip data or macro data based on the presence or absence of a cell belonging to the I/O cell type;

second means for calculating a first area estimate based on first cells tabulated in the given net list and belonging to the I/O cell type;

third means for calculating a second area estimate based on the cells tabulated in the given net list and belonging to second cells other than said first cells; and fourth means for selecting one of said first and second area estimates as an output area data by comparing both the first and second estimates against each other if the given net list relates to a chip data and for selecting said second area estimate as an output area data if the given net list relates to a macro data.

10. An automatic layout system as defined in claim 1 further comprising:

fifth means for detecting a number of possible interconnect layers based on the given net list; and sixth means for multiplying said output area data by a specified coefficient based on the number of the possible interconnect layers.

11. An automatic layout system as defined in claim 9 further comprising:

fifth means for detecting a number of possible interconnect layers based on the given net list; and sixth means for multiplying said output area data by a specified coefficient based on the number of the possible interconnect layers.

* * * * *